US006285583B1

(12) United States Patent
Cleveland et al.

(10) Patent No.: US 6,285,583 B1
(45) Date of Patent: Sep. 4, 2001

(54) HIGH SPEED SENSING TO DETECT WRITE PROTECT STATE IN A FLASH MEMORY DEVICE

(75) Inventors: Lee Edward Cleveland, Santa Clara; Kendra Nguyen, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/506,351

(22) Filed: Feb. 17, 2000

(51) Int. Cl.$^7$ ................................................. G11C 16/04
(52) U.S. Cl. .................... 365/185.04; 365/191; 365/241
(58) Field of Search .............................. 365/185.04, 191, 365/241, 185.05, 189.01

(56) References Cited

U.S. PATENT DOCUMENTS

| | | | | |
|---|---|---|---|---|
| 4,509,118 | * | 4/1985 | Shenk ................................. | 364/200 |
| 5,263,000 | | 11/1993 | Van Buskirk et al. ............... | 365/226 |
| 5,291,446 | | 3/1994 | Van Buskirk et al. ......... | 365/189.09 |
| 5,349,558 | * | 9/1994 | Cleveland et al. .................... | 365/200 |
| 5,612,921 | | 3/1997 | Chang et al. ........................ | 365/226 |
| 5,708,387 | | 1/1998 | Cleveland et al. .................... | 327/536 |
| 5,847,998 | | 12/1998 | Van Buskirk .................... | 365/185.33 |
| 5,867,430 | | 2/1999 | Chen et al. ...................... | 365/189.04 |

(List continued on next page.)

OTHER PUBLICATIONS

AMD, "Common Flash Memory Interface Publication 100—Vendor & Device ID Code Assignments", Jul. 25, 1996, vol. 96.1.

AMD "Am29DL162C/AM29DL163C 16 Megabit (2 M x 8–Bit/1 M x 16–Bit) CMOS 3.0 Volt–only,Simultaneous Operation Flash Memory", Publication 21533, Rev: C Amendment/+2, Jul. 14,1999.

Intel Corporation, "1.8 Volt Intel®Dual–Plane Flash Memory 28F320D18 (x16)", Product Review Datasheet, Order No. 290672–002, Oct. 1999.

Macronix International Co., Ltd. "MXIC Advance Information MX29VW160T/B—16M–BIT [2M x 8–BIT/1M x 16–BIT]Simultaneous Read/Write Single 2.5V Operation Flash Memory", P/N:PMO567, Rev. 0.8, May 17, 1999.

ATMEL Corporation, "ATMEL®16–megabit (1M x 16/2M x 8) 3–volt Only Flash Memory", Rev. 0925H–08/99.

STMicroelectronics, "M59DRO32A, M59DR032B, 32 Mbit (2Mb x 16, Dual Bank, Page) Low Voltage Flash Memory", preliminary data, 10/1999, pp. 1–38.

"AMD—Flash Introduction", obtained at the internet address http://www.amd.com/products/nvd/overview/flash_intro.html, Apr. 14, 1999.

"AMD—Simultaneous Read/Write", obtained at the internet address http://www.amd.com/products/nvd/overview/simuintro.html, Jul. 12, 1999.

(List continued on next page.)

Primary Examiner—David Nelms
Assistant Examiner—Thong Le
(74) Attorney, Agent, or Firm—Wagner, Murabito & Hao LLP

(57) ABSTRACT

A flash memory device (100) includes a core cell array including two banks (194, 196) of core cells and address decoding circuitry (112, 114, 118, 120) and a write protect circuit. The write protect circuit includes sector write protect circuits (210) associated with respective sectors (202) of the core cell array in storing write protect data for the associated sector. The write protect circuit further includes a switch circuit (404) which selects one sector write protect signal in response to a write select signal to produce a combined write protect signal. The write protect circuit further includes an output circuit (406) coupled to the switch circuit to produce a sector write protect signal.

14 Claims, 5 Drawing Sheets

U.S. PATENT DOCUMENTS

| | | | |
|---|---|---|---|
| 5,995,415 | 11/1999 | Kuo et al. | 365/185.11 |
| 6,033,955 | 3/2000 | Kuo et al. | 438/257 |
| 6,111,787 * | 8/2000 | Akaogi et al. | 365/185.11 |
| 6,125,058 * | 9/2000 | Kuo et al. | 365/185.21 |

OTHER PUBLICATIONS

"AMD News Release #9879", obtained at the internet address http://www.amd.com/news/prodpr/9879.html. Oct. 19, 1998.

"Intel®1.8 Volt Dual–Plane 32–Mbit Flash Memory (D18)", obtained at the internet address http://www.intel.com/design/flcomp/prodbref/298131.htm, Nov. 18, 1999.

U.S. Patent Application, Ser. No. 09/159,489, filed Sep. 23, 1998.

Brian Dipert and Markus Levy "Designing with Flash Memory—The definitive guide to designing flash memory hardware and software for components and PCMCIA cards", Annabooks, ISBN 0–929392–17–5, Ch. 3, pp. 23–44, 3/94.

AMD, Technology Background brochure, "3.0 Volt–only page Mode Flash Memory Technology." 10/99.

AMD, Technology Background brochure, "3.0 Volt–only Burst Mode Flash Memory Technology." 10/99.

AMD, Technology Background brochure, "1.8 Volt–only Flash Memory Technology." 9/99.

AMD, Technology Background brochure, "AMD DL160 and DL320 Series Flash: New Densities, New Features." 9/99.

Intel Corporation, "Common Flash Memory Interface Specification", Release 1.1, May 30, 1997.

* cited by examiner

HIGH SPEED SENSING TO DETECT WRITE PROTECT STATE IN A FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modem flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds. To erase an entire chip can take up to 49 seconds. While programming is much faster, on the order of 7 to 300 micro-seconds, it is still slow compared to other memory devices. Programming an entire chip can take up to 7 seconds (including the time to verify the data). Typically, standard Dynamic Random Access Memory ("DRAM") offers access times on the order of nano-seconds, a difference between micro-seconds of many orders of magnitude.

This complex nature of programming and erasing flash memory devices leads to a major problem in that they do not provide sufficiently fast random access. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

To control the process of writing or erasing data, write protect circuits are included in a flash memory. A write protect signal is generated by such circuits to indicate that a memory cell is protected and should not be overwritten. However, to achieve efficiency in layout area, such write protect circuits should be located throughout the memory device. This can require substantial routing of signal lines to control and detect the write protect signals. However, this leads to excessive capacitance on the signal lines, which slows the write protect circuit down.

Accordingly, there is a need for an efficiently designed and manufacturable flash memory device that allows rapid detection of a write protected state.

SUMMARY OF THE INVENTION

The present invention is defined by the following claims, and nothing in this section should be taken as a limitation on those claims. By way of introduction, the preferred embodiments described below relate to a method and apparatus for high speed sensing and detection of write protect state in a flash memory device.

To increase layout efficiency on an integrated circuit, write protect data storage circuits are located at each sector of the core cell array of the flash memory device. The sectors are grouped in an upper bank and a lower bank. Two group write protect signals are the logical combination of the write protect data for each sector in the two groups. As addresses are selected for writing or erasing, the group write-protect signal is generated if an address sector is write protected.

A switch circuit selects one of the two group write protect signals based on the selected sector address for generating a sector write protect signal. The sector write protect signal is normally active and is only driven to an inactive level when an unprotected sector is addressed. A feedback circuit ensures the active level is generated in sufficient time to prevent writing a protected sector after writing an unprotected sector.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the FIGS, and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
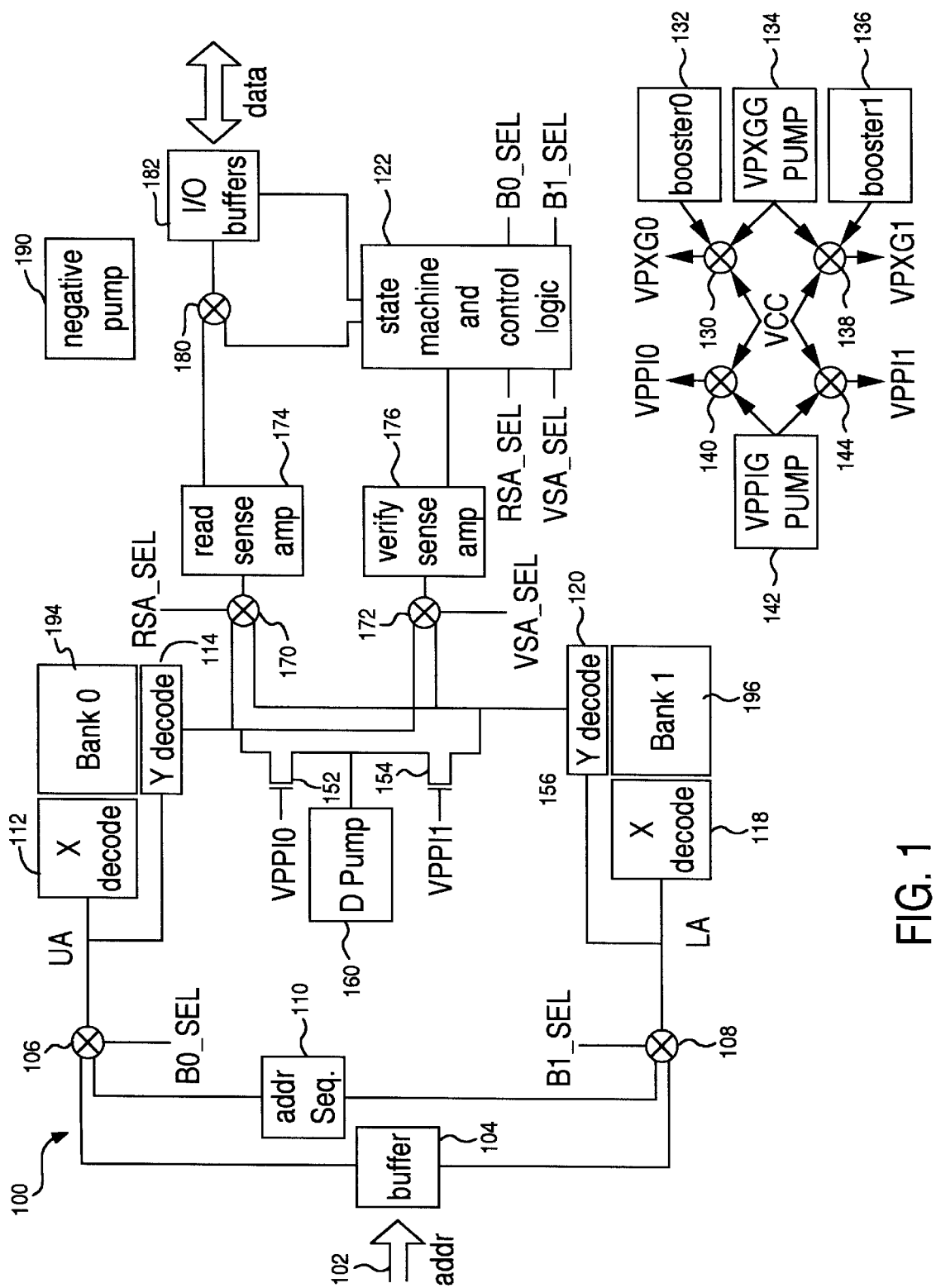
FIG. 1 depicts a block diagram of a flash memory device.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:51]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,029, "METHOD OF MAKING FLEMBLY PARTITIONED METAL LINE SEGMENTS FOR A SIMULTANEOUS OPERATION FLASH MEMORY WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

Figure 2:
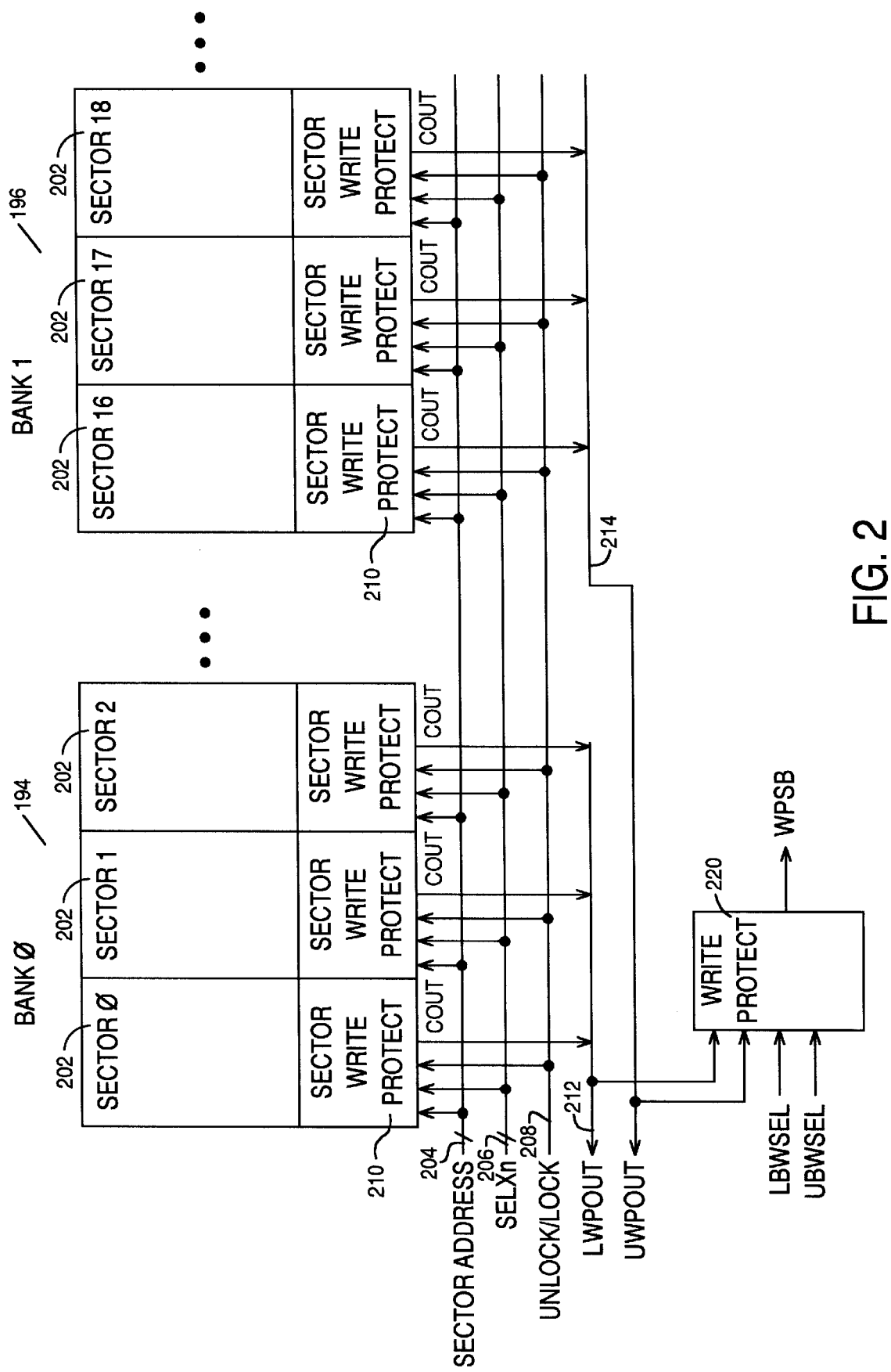
FIG. 2 is a block diagram of a portion of the flash memory device of FIG. 1.

FIG. 2 is a block diagram of a portion of the flash memory device 100 of FIG. 1. FIG. 2 illustrates an exemplary sector architecture for the memory device 100. Preferably, each of the first bank 194 and the second bank 196 is partitioned into a plurality of sectors 202. Each sector 202 has a predetermined size, which may be the same for all sectors, such as 512 rows by 128 columns. Each bank 194, 196 may have the same or a different number of sectors. First bank 194 may be referred to as the lower bank and second bank 196 may be referred to as the upper bank.

Access to the sectors 202 is controlled by control signals. Each sector is uniquely addressed by a sector address on a multi-bit sector address line 204. The sector addresses are provided to each sector 202 to select one sector for reading, writing or erasing. Each sector 202 is further provided with a sector enable latch signal on a sector enable latch line 206, labeled SELXn. The sector enable latch line 206 conveys a signal to each sector 202 indicating that a sector enable latch (not shown) has been set, permitting access to that sector. The sector enable latch line 206 is a multi-bit line carrying a total of n signals, wherein n is an integer from 1 to the total number of sectors on the memory device 100.

Each sector 202 is further provided with a lock signal and an unlock signal on a line 208. In the illustrated embodiment, the lock and unlock signals share a common node or line 208. In alternative embodiments, two individual lines may be used. The lock and unlock signals control the write protect state of the individually selected sector. By asserting the lock signal, the sector may be write protected. By asserting the unlock signal, the sector may be unprotected.

Each sector 202 includes a sector write protect block 210. The sector write protect block controls, at the level of each sector, the write protect operation of the sector. Further structure and operation of the sector write protect block 210 will be described below in connection with FIG. 3. The sector write protect block 210 receives the sector enable latch signal on line 206 and the lock and unlock signals on line 208. Further, the sector write protect block 210 generates an output signal labeled COUT.

In accordance with the present invention, the output signals labeled COUT from the sector write protect blocks 210 for all sectors 202 associated with first bank 194 are logically combined on a line 212. Similarly, the output signals labeled COUT from the sector write protect blocks 210 of second bank 196 are logically combined on a line 214. The lines 212, 214 are labeled LWPOUT and UWPOUT, respectively, in FIG. 2. The lines 212, 214 are provided to a write protect control circuit 220. Structure and operation of the write protect control circuit 220 will be described in greater detail below in conjunction with FIG. 4.

Thus, for layout efficiency, the sector write protect circuits 210 associated with each sector 202 are placed directly next to or together with each respective associated sector 202. Necessary signals are routed to the sector write protect circuits 210. Output signal COUT from each of the sector write protect signals 210 are combined for each of the two respective banks 194, 196, for example, by wire ORing the outputs from each of the sector write protect circuits 210.

Figure 3:
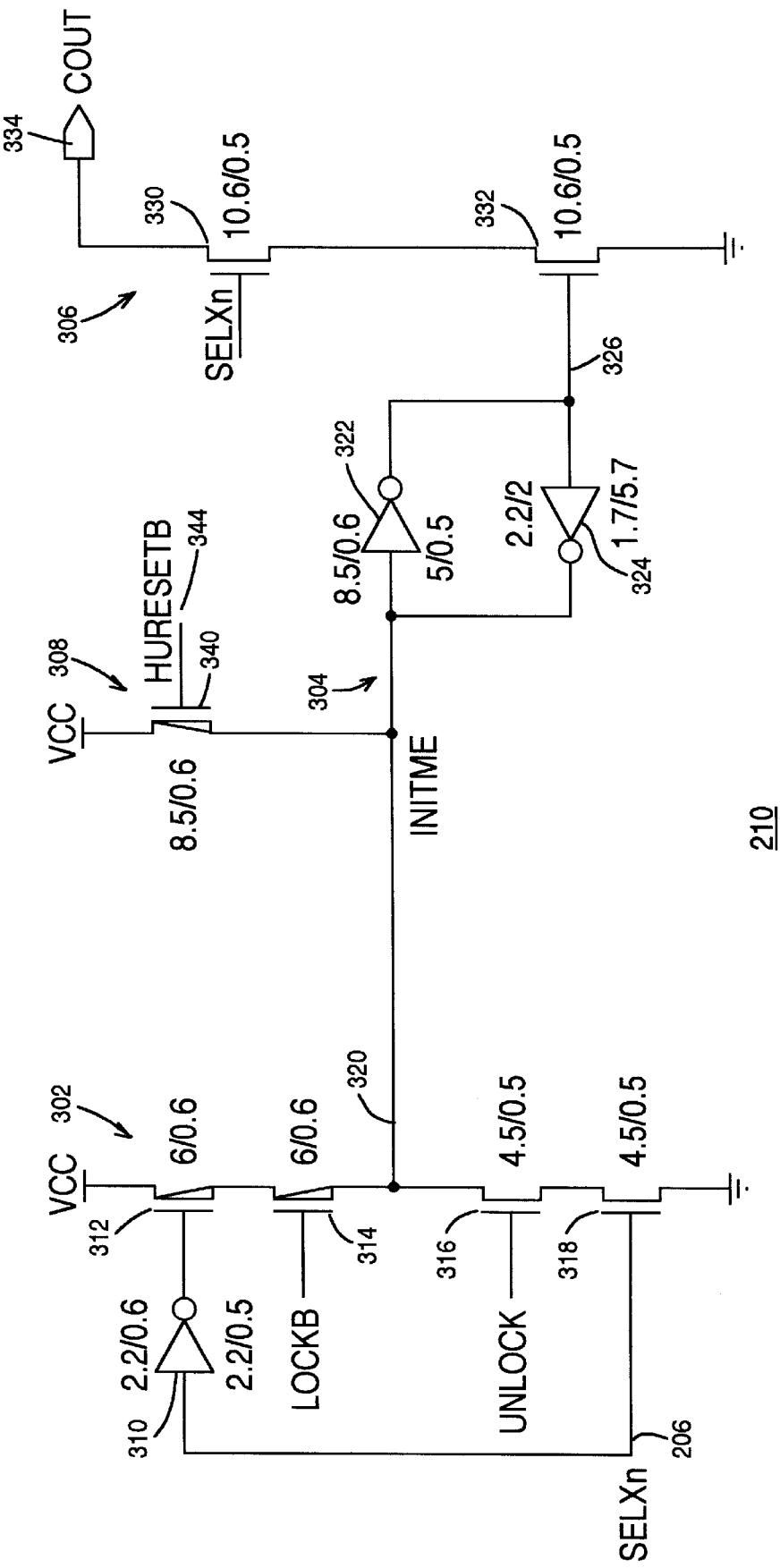
FIG. 3 is circuit diagram of a sector write protect cell of the flash memory device of FIG. 1.

FIG. 3 is a circuit diagram of a sector write protect circuit 210 for use in the flash memory device as embodied in FIG. 2. The sector write protect circuit 210 is preferably arranged in close proximity to an associated sector of core memory cells and controls the write protect status of the associated sector. When a sector is write protected, any change to data stored in that sector is inhibited. Thus, a write operation or an erase operation are prevented from occurring by the write protect state of the sector write data stored in the sector write protect circuit 210.

The sector write protect circuit 210 includes an input circuit 302, a write protect latch 304, an output circuit 306 and a reset circuit 308. The input circuit 302 includes an inverter 310, a first transistor 312, a second transistor 314, a third transistor 316 and a fourth transistor 318. The inverter 310 has an input coupled to the sector enable latch line 206 for receiving a sector enable latch signal, labeled SELXn in FIG. 3. The sector enable latch signal is also provided to the gate of transistor 318. The output of the inverter 310 is provided to the gate of transistor 312. Transistor 314 has a gate configured to receive the lock signal and transistor 316 has a gate configured to receive the unlock signal. Transistor 312 and transistor 314 are both p-channel transistors, and transistor 316 and transistor 318 are both n-channel transistors.

The input circuit 302 has an output 320. A signal labeled INITME in FIG. 3 is produced at the output 320. This signal is the input to the write protect latch 304. The write protect latch 304 includes a first inverter 322 and a second inverter 324. The two inverters 322, 324 are cross coupled in conventional format to form a data storage circuit. Other types of data storage circuit may be substitute as well. The write protect latch 304 stores the write protect data for the sector associated with the sector write protect circuit 210. The write protect latch 304 has an output 326 coupled to the output circuit 306.

The output circuit 306 includes a first transistor 330 and a second transistor 332. The first transistor 330 has a gate coupled to the sector enable latch line 206 to receive the sector enable latch signal SELXn. The drain of the first transistor 330 is coupled to an output 334 of the sector write protect 210. The source of the transistor 330 is coupled to the drain of the second transistor 332, which also has a source coupled to ground. The gate of the second transistor 332 is coupled to the output 326 of the write protect latch 304.

The reset circuit 308 includes a transistor 340. The transistor 340 has a gate coupled to a reset line 342 to receive a reset signal, labeled HWRESATB in FIG. 3. The transistor 340 has a source coupled to the positive power supply labeled $V_{CC}$ and a drain coupled to the input of the write protect latch 304. When an active-low reset signal is received on the reset line 344, the transistor 340 turns on, pulling the signal labeled INITME to a voltage near the positive supply potential, resetting the write protect latch 304.

Thus, after a hardware reset, accomplished by assertion of the reset signal on the reset line 344, the input to the write protect latch 304 will be set high. The output 326 of the write protect latch 304 will be low, turning off the transistor 332. With no pulldown path to ground through the transistors 330, 332, the output 334 will be floating regardless of the state of the sector enable latch signal SELXn. During a lock or unlock command sequence, a user can change the value of the write protect latch 304 so that the sector can be unlocked for subsequent erasing or programming. If a selected sector is to be unprotected, then the unlock signal at the gate of the transistor 316 will be high. When the sector enable latch signal for the selected sector is asserted on the line 206, the output 320 of the input circuit 302 will be pulled low. Consequently, the output 326 of the latch 304 will be pulled high and, during the next assertion of the sector enable latch signal SELXn, the output 334 will be pulled to ground. Similarly, if the sector is to be write protected, the lock signal labeled LOCKB will be driven low when the sector enable latch signal on the line 206 is asserted. This will pull the output 320 to a logic high level, resetting the latch and pulling the output 326 of the latch 304 to a low level. When the sector enable latch line SELXn is later asserted, the output 334 will float.

As noted above in conjunction with FIG. 2 the output signals COUT from each of the sector write protect circuits 210 are logically combined on two lines 212, 214. All outputs COUT from sector write protect circuits associated with sectors of first bank 194 are combined on the line 212. Similarly, all outputs COUT from sectors of second bank 196 are combined on line 214. While any sort of logical combination of these output signals COUT may be performed, use of the embodiment of the sector write protect circuit 210 shown in FIG. 3 permits wire ORing of the outputs 334 of the respective sector write protect circuits 210. Since the signal COUT at the output 334 floats or enters a high impedance state when the write protect latch is reset, the outputs 334 may be simply wired together so that any active sector write protect circuit 210 will drive the outputs 334 and the lines 212, 214 low.

Figure 4:
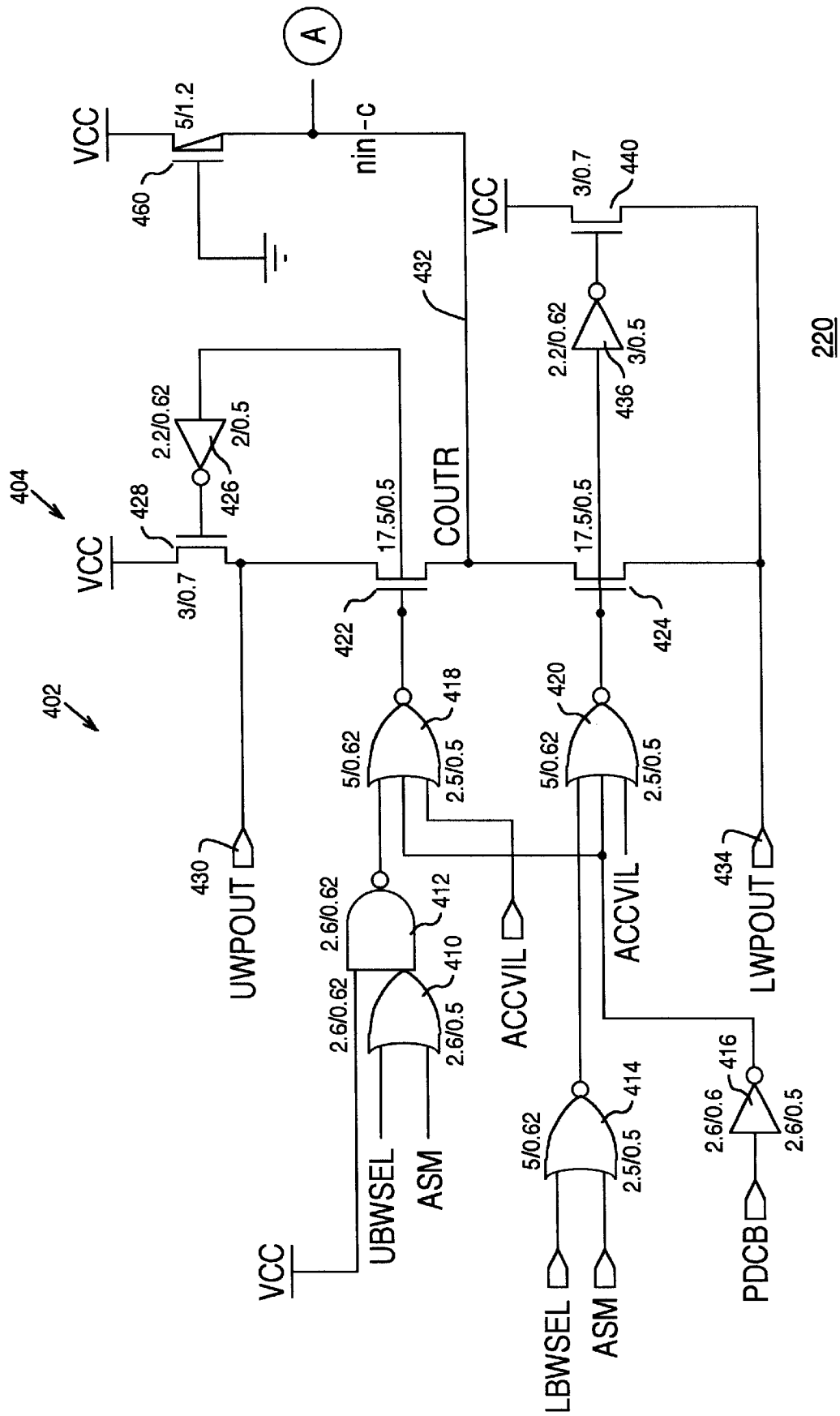
FIG. 4 is a circuit diagram of a write protect control circuit for use in the flash memory device of FIG. 1.
Figure 4:
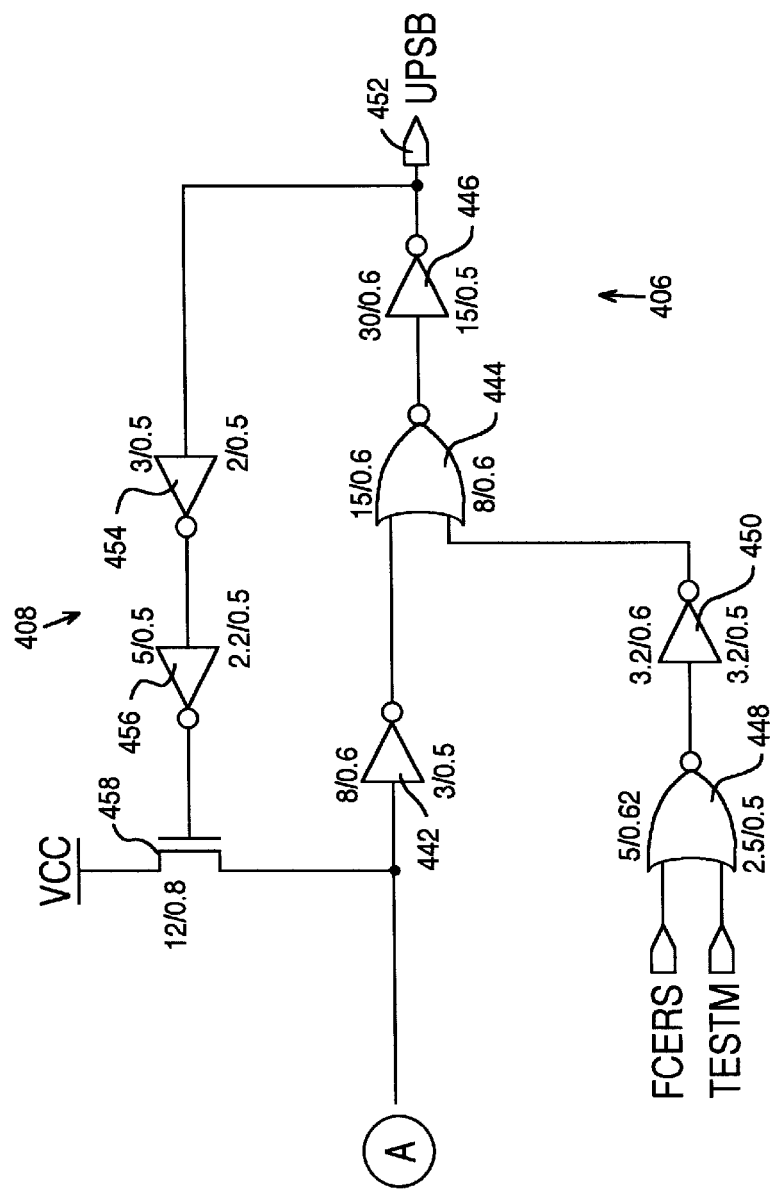

FIG. 4 illustrates a write protect control circuit for use in the flash memory 100 of FIG. 1 as embodied in FIG. 2. The write protect control circuit 220 includes an input circuit 402, a switch circuit 404, an output circuit 406 and a feedback circuit 408.

The input circuit 402 includes an OR gate 410, a NAND gate 412, a NOR gate 414, an inverter 416, a NOR gate 418 and a NOR gate 420. The NOR gate 410 receives two input signals. The second bank write select signal, labeled UBWSEL is generated when an address in the second bank 196 (FIG. 1) is selected for writing or erasing. The signal ASM is active when the flash memory 100 is in auto select mode. The NAND gate 412 combines the output of the OR gate 410 and a logic one value to produce a first input to the NOR gate 418. A first bank write select signal LBWSEL, is received at an input of the NOR gate 414. This signal is active when the first bank 194 (FIG. 1) is to be accessed for writing or erasing. The signal ASM is applied to the other input of the NOR gate 414. The output of the NOR gate 414 is provided to a first input of the NOR gate 420. The NOR gates 418 and 420 both receive additional control signals, labeled ACCVIL and PDCB in FIG. 4, which are not of interest in this discussion.

The switch circuit 404 includes a first transistor 422, a second transistor 424, an inverter 426 and a third transistor 428. The first transistor 422 has a drain connected to a first input 430 labeled UWPOUT in FIG. 4. Input 430 is coupled to the second line 214 (FIG. 2) which carries the logical combination of the output signals from the sector write protect circuits 210 associated with sectors 202 of the second bank 196. The transistor 422 has a source coupled to a combined write protect node 432 which carries a combined write protect signal, labeled COUTR. The gate of the transistor 422 is controlled by the output of the NOR gate 418. The transistor 424 has a drain coupled to the combined write protect node 434 and a source coupled to a second input 434. The second input 434 receives the signal LWPOUT, and is coupled to the line 212 in FIG. 2. Line 212 is a logical combination such as the wire OR of the output signals COUT from each of the sector write protect circuits 210 of the sectors 202 of bank zero 194. The gate of the transistor 424 is controlled by an output of the NOR gate 420. The switch circuit 404 further includes an inverter 436 and an inverter 440. Inverter 426 has an input coupled to the output of the NOR gate 418 and an output coupled to the gate of the transistor 428. The transistor 428 has a drain coupled to the positive supply voltage $V_{CC}$ and a source coupled to the output 430. The inverter 436 has an input coupled to the output 420 of the NOR gate 420 and an output coupled to the gate of the transistor 440. The transistor 440 has a drain coupled to the positive supply voltage $V_{CC}$ and a source coupled to the input 434.

The output circuit 406 includes an inverter 442, a NOR gate 444, an inverter 446, a NOR gate 448 and an inverter 450. The inverter 442 has an input coupled to the combined write protect node 432 and an output coupled to an input of the NOR gate 444. The other input of the NOR gate 444 is coupled to the output of the inverter 450. Inverter 450 is driven by the output of the NOR gate 448, which receives two control signals, FCERS and TESTM which are not of interest in this discussion. The output of the NOR gate 444 drives the inverter 446. The output of the inverter 446 is coupled to an output 452, which is the output of the write protect control circuit 220. The output 452 conveys a sector write protect signal, labeled WPSB.

The feedback circuit 408 includes an inverter 454, an inverter 456, a transistor 458, and a transistor 460. The inverter 454 has an input coupled to the output 452. The output of the inverter 454 is coupled to the input of the inverter 456. The output of the inverter 456 drives the gate of the transistor 458. The transistor 458 is an n-channel transistor having a drain coupled to $V_{CC}$, the positive power supply, and a source coupled to the combined write protect node 432. The power transistor 460 has a gate coupled to ground, a source coupled to $V_{CC}$ and a drain coupled to the combined write protect node 432.

The write protect control circuit 220 controls the assertion of the sector write protect signal WPSB at the output 452. The sector write protect signal WPSB controls the write protect state of the flash memory 100. The sector write protect signal WPSB determines if writing will be inhibited for a sector as the sector is being addressed. For example the state machine and control logic 122 (FIG. 1) performs an embedded operation to write or erase data in the flash memory. The state machine and control logic 122 asserts control signals including a sector address to select a sector for modification. In response, the sector write protect signal is generated to provide an indication of the write protect status of the selected sector.

In the illustrated embodiment of the flash memory 100, the speed of transition of the sector write protect signal WPSB is critical. In order to ensure that the write protect status is correctly recorded for sectors which are either write protected or unprotected, the sector write protect signal must attain the correct logical state very quickly. In the present embodiment, the sector write protect signal WPSB has a default value of logic zero. It only goes high, to a logic one value, if a selected sector is not write protected. During the writing of a sector erase command by the state machine and control logic 122 (FIG. 1), the transitions on the sector write protect signal must be fast when a sector address is selected to be latched for the erase operation. If the sector entered for erase is protected, WPSB should remain low.

The sector write protect signal WPSB is derived from the combined write protect signal COUTR. COUTR in turn is generated from one of UWPOUT and LWPOUT, which are the logical combination of the write protect signals COUT generated at each sector. Because of the substantial capacitance associated with the COUT signals, these signals are combined separately for each bank 194, 196. The switch circuit 404 selects or multiplexes the signals UWPOUT and LWPOUT to reduce the transition time on the combined write protect node 432 and signal COUTR. This reduces the time for transitions of the signal WPSB.

The switch circuit 404 is controlled by the write select signals, UBWSEL and LBWSEL. Only one of these signals can be active at a time. UBWSEL indicates that a write operation is to occur in the second bank 196 (FIG. 2). When the signal LBWSEL is active, it indicates that a write operation is to occur in the first bank 194. As presently embodied, the dual bank memory 100 permits simultaneous read and write in the banks 194, 196. However, writing cannot occur in both banks 194, 196, so only one of UBWSEL and LBWSEL will be active. The other control signals associated with the input circuit 402 are preferably in a logic state suitable for the gates 410, 412, 414, 418, 420 to pass the state of UBWSEL and LBWSEL to the switching circuit 404.

If UBWSEL is high or active, indicating that a write is to occur in the second bank 196, the transistor 422 is turned on. This couples the input 430 to the source of the transistor 422, tied to the combined write protect node 432. Since the input 430 receives the sector write protect output UWPOUT, which is the logical combination of the outputs of the sector write protect circuits 210 for second bank 196, the sector write protect output signal UWPOUT is provided to the combined write protect node 432 as the combined write protect signal COUTR.

Similarly, if a write is to occur in first bank 194, the write select signal LBWSEL will be active. This signal will be conveyed to gates 414, 420 to the gate of the transistor 424. Assertion of the write select signal LBWSEL turns on the transistor 424, coupling the sector write protect output signal LWPOUT to the combined write protect node 432. The sector write protect output signal LWPOUT is the logical combination of the output signals COUT from the sector write protect circuits 210 of first bank 194 (FIG. 2). Thus, asserting the sector write select signal LBWSEL selects the sector write protect output signal LWPOUT and produces a combined write protect signal COUTR on the combined write protect node 432.

The output circuit 406 is coupled to the switch circuit 404 and produces the sector write protect signal WPSB in response to the combined write protect signal COUTR. When either of the transistors 422, 424 turn on, the combined write protect node 432 is driven high. This signal is buffered and inverted by the inverter 442, and inverted again by the NOR gate 444. The signal is finally inverted by the inverter 446 and provided as an active low sector write protect signal WPSB at the output 452.

It has been discovered that, due to charge sharing on the sector write protect output nodes UWPOUT, LWPOUT, the combined write protect node 432 gets pulled low at the time when the n-channel pass gate transistors 422, 424 just gets turned on. This produces a glitch or dip in the combined write protect signal COUTR. This dip in COUTR propagates through the output circuit 406 and creates a pulse on the sector write protect signal WPSB. As a result of the pulse, the write protect status of the selected sector may be unreliably received. This can result in accurate data and unintended write protection, or may require slowing down the writing operation while the dip is suppressed. Either result is undesirable.

To avoid or reduce this problem, the transistor 428 is added to the input 430. When the pass gate transistor 422 is turned off, the transistor 428 clamps the input 430 at a voltage substantially equal to $V_{CC}$ minus the threshold voltage of transistor 428. Similarly, transistor 440 is added to the input 434 to clamp the input 434 at a voltage substantially equal to VCC minus the threshold voltage of transistor 440. The transistor 428 is controlled by write select signal UBWSEL, as applied to the pass gate transistor 422 and the inverter 426. Similarly, the transistor 440 is controlled by the write select signal LBWSEL as applied to the pass gate transistor 424 and the inverter 436. As soon as the respective pass gate transistor 422, 424, is turned on, the associated pull up transistor 428, 440 is turned off. Even though turned off, the pull up transistors 428, 440 still prevent the combined write protect node 432 from experiencing the charge sharing dip during switching.

If a sector entered for erase is not protected, the sector write protect signal WPSB needs to go high fast enough to enable the appropriate sector writing circuitry. Unfortunately, the pull down path consisting of transistor 422, 424 in the write protect control circuit 220 and transistor 330 and transistor 332 in the sector write protect circuit 210 (FIG. 3) is in conflict with the pull up p-channel transistor 428 and the scaled trip point of inverter 442. It is known to adjust the relative geometry of the n-channel and p-channel transistors which form an inverter such as the inverter 442 to change the trip point of the inverter. The trip point is the input voltage that will cause the output state of the inverter to flip. Adjusting the trip point downward favors a faster transition of the inverter output when the input is switching from low to high. Adjusting the trip point upward favors a faster transition of the inverter output when the input is switching from high to low. The same principle can be applied to other types of logic circuits which may be used in place of the inverter 442. The inverter 442 responds to the state of the combined write protect signal COUTR at its input, so scaling the trip point of the inverter 442 adjusts its sensitivity to the signal COUTR.

Under the conditions described above, the sector write protect signal goes high too slowly. In order to improve performance, the pull down strength of the inverter 442 is preferably increased by increasing the width to length ratio of the N-channel transistor forming the inverter 442. Further, the trip point of the inverter is shifted to favor pull up by the p-channel transistor forming the inverter 442. This permits the sector write protect signal WPSB to go high faster.

However, another problem is encountered when a consecutive sector is entered for erase. If the next sector to be addressed is write protected, the sector write protect signal WPSB needs to rapidly return to a low logic level. Since the size of the pull up PMOS transistor 460 cannot be further adjusted nor can the trip point of the inverter 442 be further adjusted without altering the pull up performance of the output 452, another helper transistor is added for this transition instead.

This is the function provided by the feedback circuit 408. When the sector write protect signal WPSB goes high, transistor 458 will turn on. However, the pull down path, including pass gate transistor 422, 424 and transistors 330, 332 in the sector write protect circuit 210 (FIG. 3) will drive the combined write protect node 432 down to approximately ground potential. This results in the combined write protect signal COUTR staying at a level much less than $V_{CC}$ minus the threshold voltage of transistor 428, 440. This is a voltage which is not high enough to flip the inverter 442, which is now scaled so that its pull down strength is weak.

As soon as a protected sector address is entered and the write select signal UBWSEL, LBWSEL is asserted, the pull down path will get disconnected from ground potential. The output COUT of the selected sector write protect circuit 210 will be floated, in a high impedance state. As a result, the combined write protect signal COUTR on node 432 quickly is pulled to a voltage of $V_{CC}$ minus a threshold voltage, by operation of the helper transistor 458. The pull up transistor 460 pulls the combined write protect signal COUTR on node 432 up the rest of the way to a voltage of $V_{CC}$. After WPSB goes low, the helper transistor 458 and the feedback circuit 408 are turned off, so that it will not affect the next transition.

From the foregoing, it can be seen that the present invention provides a flash memory device allowing rapid, reliable detection of a write protected state. Write protect data is stored at each respective sector of the flash memory. Sector write protect signals are generated at each respective sector and logically combined into a first group and a second group, corresponding to the two banks of the flash memory. A switch circuit rapidly selects the appropriate combined sector write protect signal. An output circuit is tailored to speed the transitions on the sector write protect signal which controls the overall write protect function of the flash memory.

The figures give illustrative channel width to length ratios (measured in micrometers or microns) for the transistors which make up the depicted circuit. While the figures show the preferred channel width to length ratios for one embodiment, it will be appreciated that other ratios may also be used depending on the design requirements and the capabilities of the manufacturing process.

It is therefore intended that the foregoing detailed description be regarded as illustrative rather than limiting, and that it be understood that it is the following claims, including all equivalents, that are intended to define the spirit and scope of this invention.

What is claim is:

1. A method for operating a memory device, the method comprising:
    generating a plurality of group write protect signals (qWPOUT) when a selected sector of a group of sectors is write protected;
    generating a sector write protect signal (WPSB) in response to the group write protect signals (qWPOUT) and a group write select signal (qBWSEL), said group write select signal (qBWSEL) switching a plurality of said group write protect signals (qWPOUT); and
    inhibiting writing data in the selected sector in response to the sector write protect signal (WPSB).

2. The method of claim 1 wherein generating the group write protect signal comprises:
    generating a plurality of write protects signals at each of a plurality of write protect circuits, each write protect circuit associated with a sector of the memory device; and
    combining the plurality of write protect signals to generate the group write protect signal.

3. The method of claim 2 wherein generating the group write protect signal further comprises:
    generating a signal on an output node of each of the plurality of write protect circuits when the sector associated with the write protect circuit is write protected; and
    otherwise, floating the output node.

4. The method of claim 1 further comprising:
    generating the group write select signal (qBWSEL) when a sector to be written is in the group of sectors.

5. The method of claim 1 further comprising:
    clamping the group write protect signal (qWPOUT) at a predetermined voltage when the group write select signal (qBWSEL) is inactive.

6. The method of claim 1 further comprising:
    selecting one of a first group write protect signal (UWPOUT) and a second group write protect signal (LWPOUT) in response to the group write select signal (UBWSEL, LBWSEL) to activate a combined write protect signal (COUTR).

7. The method of claim 6 further comprising:
    biasing the combined write protect signal (COUTR) in a feedback path from the sector write protect signal (WPSB) to rapidly return the combined write protect signal (COUTR) to a write protected level when a next selected sector is write protected.

8. A memory device comprising:
    a core cell array including a plurality of sectors of core cells;
    address decoding circuitry to generate a sector enable signal (SELx);
    a write protect circuit, including
        a plurality of sector write protect blocks, each sector write protect block configured to store write protect data for an associated sector and having a sector write protect output (COUT), said sector write protect outputs (COUT) being combined into a plurality of group write protect signals (UWPOUT, LWPOUT),
        a switch circuit configured to select one group write protect signal (UWPOUT, LWPOUT) in response to a write select signal (UBWSEL, LBWSEL) and producing a combined write protect signal (COUTR),
        an output circuit coupled to the switch circuit to produce a sector write protect signal (WPSB) in response to the combined write protect signal (COUTR); and
    a write circuit to selectively write data to a sector defined at least in part by the sector enable signal (SELx) except upon the occurrence of the sector write protect signal (WPSB).

9. The memory device of claim 8 wherein the plurality of sector write protect blocks are grouped into a first group and a second group, the respective sector write protect outputs of the first group being logically ORed together to form a first group write protect signal (UWPOUT) and the respective sector write protect outputs of the second group being logically ORed together to form a second group write protect signal (LWPOUT).

10. The memory device of claim 9 wherein each sector write protect block comprises:
    a latch to store the write protect data for the associated sector.

11. The memory device of claim 9 wherein each sector write protect block comprises:

an output transistor for providing the write protect data for the associated sector to the first group write protect signal.

12. The memory device of claim 9 wherein the switch circuit comprises a multiplexer for selectively coupling one of the first group write protect signal (UWPOUT) and the second group write protect signal (LWPOUT) to node to form the combined write protect signal (COUTR).

13. The memory device of claim 8 wherein the output circuit comprises a feedback path from the sector write protect signal (WPSB) to the combined write protect signal (COUTR), the feedback path configured to rapidly return the combined write protect signal (COUTR) to a write protected level when a next selected sector is write protected.

14. A memory device comprising:

a plurality of sectors of memory core cells;

addressing means for generating a sector enable latch signal (SELx) for selecting one sector of the plurality of sectors;

write protect means for producing a sector write protect signal, including a plurality of write protect data storage means for storing write protect data for each respective sector and generating a sector write protect output signal (COUT), combining means for combining sector write protect output signals (COUT) from a first group of write protect data storage means (SELx) to produce a first group write protect signal (UWPOUT) and for combining sector write protect output signals (COUT) from a second group of write protect data storage means (SELx) to produce a second group write protect signal (LWPOUT), selecting means for selecting one of the first group write protect signal (UWPOUT) and the second group write protect signal (LWPOUT) to produce a combined write protect signal (COUTR), output means for producing a sector write protect signal (WPSB) in response to the combined write protect signal (COUTR); and write means for writing data to core cells of a selected sector except in the presence of the sector write protect signal.

* * * * *